July 10, 1951 M. RHEINGOLD ET AL 2,559,662

MULTIPLE REACTION CIRCUIT AMPLIFIER

Filed Nov. 13, 1946 2 Sheets-Sheet 1

INVENTORS
STANISLAS VAN MIERLO
MICHAEL RHEINGOLD
BY
Robert Harding Jr.
ATTORNEY

MULTIPLE REACTION CIRCUIT AMPLIFIER

Filed Nov. 13, 1946 2 Sheets-Sheet 2

INVENTORS
STANISLAS VAN MIERLO
MICHAEL RHEINGOLD
BY Robert Harding Jr.
ATTORNEY

Patented July 10, 1951

2,559,662

UNITED STATES PATENT OFFICE 2,559,662

MULTIPLE REACTION CIRCUIT AMPLIFIER

Michael Rheingold and Stanislas Van Mierlo, Zurich, Switzerland, assignors to International Standard Electric Corporation, New York, N. Y., a corporation of Delaware Application November 13, 1946, Serial No. 709,662
In Switzerland April 30, 1945

Section 1, Public Law 690, August 8, 1946
Patent expires April 30, 1965

9 Claims. (Cl. 179—171)

The present invention relates to feedback amplifiers and particularly to feedback amplifiers with at least two paths for feedback. The characteristic curves of the feedback paths control the output level of the amplifier.

If one of the feedback paths is independent of the frequencies being amplified then the output of the amplifier will be in general very constant. If the other feedback path allows a sudden and large increase in the amount of feedback for certain frequencies then the shape of the output curve of the amplifier will be, in general very constant, but at the certain frequencies the level of the output will drop suddenly. That is, if the reverse feedback circuit greatly amplifies the amount of feedback of certain frequencies, the amplifier itself greatly attenuates these frequencies.

The object of this invention is to provide an amplifier with a constant level of output but with a sudden reduction in the output at certain frequencies. The invention ensures that this reduction is sharp and sudden and it supplies means for adjusting accurately the frequency at which the reduction occurs.

A preferred embodiment provides a first reverse feedback circuit independent of the frequency, the reaction factor whereof is smaller or greater than that of the unit that is amplifying or attenuating, and a second reverse feedback circuit comprising an auxiliary amplifier provided, itself, with a reverse feed-back circuit the attenuation whereof is variable with the frequency. Such a device ensures a relatively constant output for the unit, save at frequencies where the reverse feedback circuit of the auxiliary amplifier presents a very great attenuation. Thus very sudden reductions of the level may be obtained.

If the reverse feedback circuit of the auxiliary amplifier shows a known filter characteristic (band pass, band stop, high pass, low pass), the unit will also produce such a characteristic however with more sudden level drops. In certain cases it is particularly interesting to use in this reverse feedback circuit, alone or in combination with other circuit elements, one or more resistance or condenser bridges presenting one or more attenuation maxima.

It is then possible to shift the values of the frequencies at which these maxima are produced by changing the value of certain resistances or capacities of these bridges.

The use of a resistance and capacity bridge is particularly valuable for relatively low frequencies avoiding thus the use of a bulky and not very stable inductance coils.

In the present description an amplifier is shown as an illustrative embodiment comprising the features and objects of the invention, namely the elimination of a very narrow and variable frequency band, whilst giving a relatively constant level for the other frequencies. Such a device may be used to analyze a frequency spectrum or measure a distortion constant.

Figure 1:
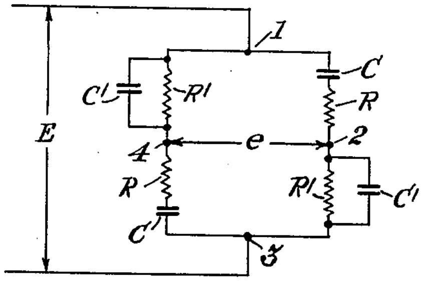
Figure 2:
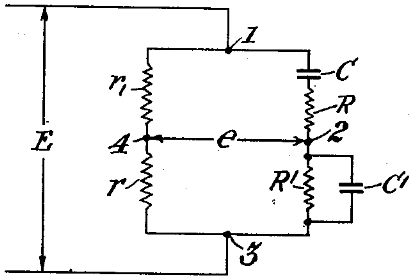
Figure 3:
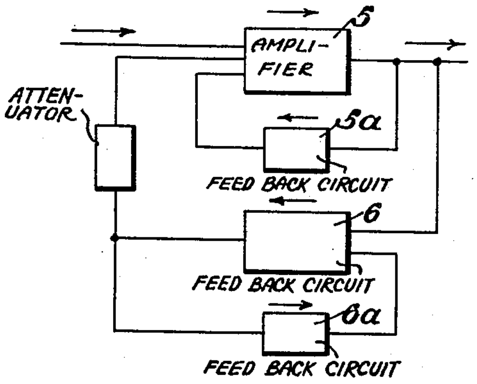
Figure 4:
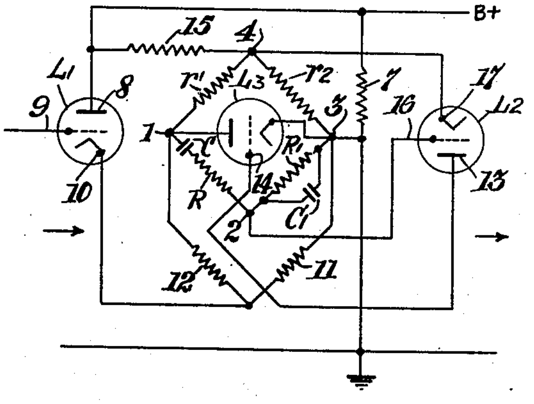
Figure 5:
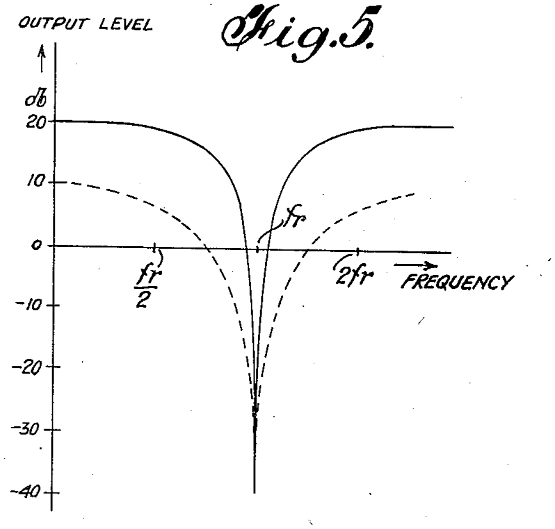
Figure 7:
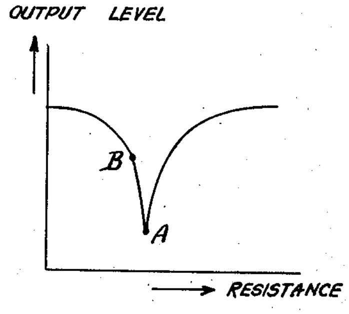
Figure 6:
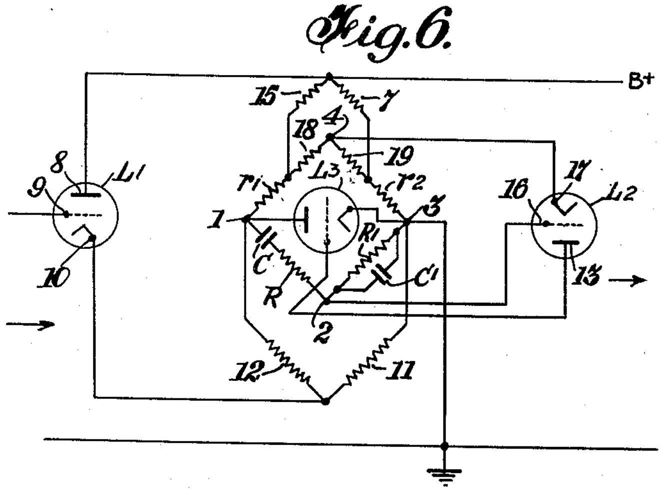
Figure 8:
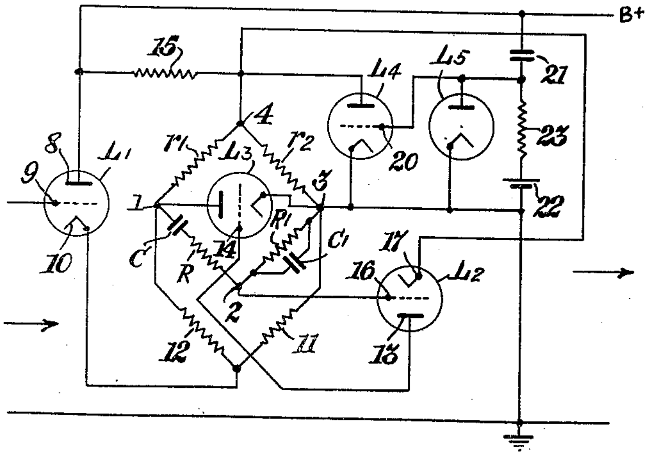

Further objects and embodiments of the invention will be discussed in the following description and in the attached drawings, where Fig. 1 shows the diagram of a resistance and a condenser bridge, Fig. 2 shows the diagram of a simple resistance and condenser bridge, Fig. 3 shows a basic diagram of the amplifier according to the invention, Fig. 4 shows a simplified circuit corresponding to the diagram of Fig. 3, Fig. 5 shows a curve of the output level, Fig. 6 shows another simplified circuit corresponding to the diaghram of Fig. 3, Fig. 7 shows a curve of the output level as function of the resistance bridge arm and Fig. 8 shows a simplified circuit comprising an automatic bridge-attenuation adjustment.

The bridge shown in Fig. 1 will be named "complete RC" bridge and that in Fig. 2 "simple RC" bridge.

In Fig. 1 the four terminals of the bridge 1, 2, 3 and 4 are connected by four arms comprising two pairs. The arm between terminals 1 and 2, and that between the terminals 3 and 4 consist of a resistance and a condenser in series of values R and C respectively. The arm between the terminals 1 and 4 and that between the terminals 2 and 3 consist of a parallel circuit one arm of which is a resistance $R_1$ and one arm of which is a condenser $C_1$.

If the values of R, C, $R_1$, and $C_1$ in the complete bridge are chosen so that we have for the central or "resonance" frequency $f_r$:

$$\frac{1}{2\pi f_r.RC}=2\pi f_r.R_1.C_1$$

and so that $$R=\frac{R_1}{WC_1R_1+1}$$

then the impedances of the four arms have the same value and the ratio $e/E$ between the output and the input voltage is, for said frequency, theoretically zero and the attenuation therefore infinite. For frequencies different from $f_r$ it can be demonstrated that the extremity of the vector representing the output voltage $e$ describes a circumference the diameter whereof is equal to E if the bridge is connected to a very high impedance. The phase shift between $e$ and E is zero for very low or very high frequencies, and 90° near the frequency $f_r$.

Analogous considerations are valid for the single bridge of Fig. 2, but the attenuation is twice that of the "complete" bridge. In Fig. 2 a simple RC bridge is diagrammed. In this bridge there are four different arms, two consist of pure resistances $r$ and $r_1$. These lie between the terminals 3 and 4 and 4 and 1 respectively. The third arm consists of a parallel resistance and capacitance of values $R_1$ and $C_1$ respectively. The fourth arm consists of a series connection of a resistance R and a condenser C. In fact the two resistances $r$ and $r_1$ may be added to the bridge of Fig. 1 without changing its characteristics and it is noted that the bridge of Fig. 2 is then, so to speak, one half of the bridge of Fig. 1. The output voltage is divided by two.

For practical reasons identical values may be chosen for the capacities C and $C_1$ of Fig. 2. In this case if $R=R_1$ and R and C are so chosen that the impedance of the RC arm is made twice that of the $R_1C_1$ arm for the frequency $f_r$ the variation of the output voltage $e$ will be slightly less sudden than in the case of identical impedances.

In the subsequent description one of these bridge types is used, but it is to be understood that the device according to the object of the present invention may use several four terminal networks ensuring a maximum attenuation for one or several frequencies.

In practice the fact must be considered, that the resistances and capacities never have their theoretic value. There are moreover certain variations caused by temperature and humidity. The result is that the attenuation of the bridge is not infinite for the resonance frequency. In practice we may expect a value of e. g. 1000. Through this lack of balance the vector of the output voltage $e$ may, at the resonance frequency, have any phase shift from the input voltage. For the same absolute value, the effect of this output voltage in a reverse feedback circuit will be the more pronounced, the more the angle deviates from 90°. In the case of the single bridge, one of the resistance arms may be exactly adjusted when the bridge is in use and reducing the absolute value of the output voltage, sets the angle to 90°. The attenuation may then attain a very high value. If such an adjustment is undesirable, two bridges may be connected in series, which would produce a much higher attenuation than 1000. Obviously precautions must be taken to avoid or to compensate for parasitic capacities and to ensure good isolation. Also an automatic adjustment of the maximum attenuation of the bridge, as described later, may be provided.

Fig. 3 represents a basic diagram of the amplifier with its two reverse feedback circuits according to the object of the invention. The box 5 represents the amplifier according to the invention and it has an amplification factor $m$. The first feedback circuit is illustrated by the box 5$a$ and it has an attenuation or an amplification factor of value $a$. The second feedback circuit is illustrated by the box 6 and it has an amplification factor of value $m_1$. This circuit has itself a feedback circuit illustrated by the box 6$a$ and this feedback circuit has an amplification or attenuation factor $b$. Between the feedback circuit 6 and the amplifier 5 there is a coupling circuit which has a certain amount of attenuation of value $g$. The box 6 may be a tuned network and according to the invention its transmission embodiment of the invention its transmission characteristic $b$ is variable with the frequency.

The amplification of the unit is then $$A=\frac{m}{1+m.\left(a-\frac{g.m_1}{1+m_1.b}\right)} \quad (1)$$

where at least $b$ is a complex quantity.

To facilitate the discussion, we replace the Equation 1 by a simpler one. Taking into account, that the elements of the circuit are chosen so that the product $m.a$ is always great in proportion to the unity, and that $g.m_1$ is great in proportion to $a$, we may write approximately:

$$A=\frac{1+m_1.b}{gm_1+am_1.b} \quad (2)$$

Differentiating with respect to the variable $b$ we get:

$$\frac{dA}{db}=\frac{gm_1^2-am_1}{(gm_1+am_1.b)^2}=\frac{g-\frac{a}{m_1}}{(g+ab)^2}\simeq\frac{g}{(g+ab)^2} \quad (3)$$

As $m_1$ is great in proportion to $a$, the term $a/m_1$ may be neglected with regard to $g$. If $b$ is very small, a very quick variation of A is desired, or in this case the product $a.b$ is negligible compared to $g$. We obtain thus:

$$\frac{dA}{db}\simeq\frac{1}{g}$$

$g$ therefore must be small. If, on the other hand, $b$ has a somewhat greater value, it follows that A varies only slightly. The two terms of the Equation 3 must therefore be small for A to vary quickly and it follows that $a$ must be great. In order to render our supposition, that $gm_1$ be great in proportion to $a$, then $m_1$ must be great too.

The value of $m$ is of no great importance provided that the product $m.a$ be great with respect to the unity. Usually the reaction factor $a$ of the reverse feedback circuit 5$a$ is at maximum equal to the unity. In certain cases however it may be feasible to take for $a$ a value higher than the unity and a transformer or amplifier should then be used in this circuit.

It is to be noted, that with the device according to the object of the invention a very sudden decrease of the output level as a function of the frequency is obtained if $b$ is very small; a slight change only is however produce, if $b$ has a somewhat greater value; i. e. the characteristic of the unit corresponds to that of the four terminal network $b$, and also the output level falls rapidly for a slight decrease in $b$. Thus interesting characteristics may be obtained similar to those of band pass, band stop, high-pass, or low-pass filters.

In the following discussion a particular embodiment of the invention is examined in detail. In this embodiment a very narrow frequency band is eliminated, taking as a four terminal network a simple RC bridge.

We suppose $m$ to be of the order of at least 10, $a$ of the order of 1, $m_1$ of the order of 1000 and $g$ of the order of 0.05.

With such values we obtain:

1. In case the frequency is very far from $f_r$ ($b \cong 0.5$)

$$A_0=\frac{1}{a+2g}=\frac{1}{1.1} \text{ or } -0.8 \text{ db.}$$

2. In case the frequency is equal to $f_r/1.5$ or $1.5f_r$ ($b=0.1\div 1$)

$$|A_h|=\frac{0.1}{\sqrt{0.01a^2g^2}}=\frac{0.1}{0.112} \text{ or } -1 \text{ db.}$$

3. In case the frequency is equal to $f_r$ ($b=10^{-3}$)

$$|A_r|=\frac{1+10^{-3}m_1}{m_1g}=\frac{2}{50} \text{ or } -28 \text{ db.}$$

It is found that the output level is substantially the same for the cases 1 and 2 and that at resonance the level decreases about 27 db. If this is not considered sufficient, two similar devices may be connected in series and a decrease in level of 54 db. will be obtained.

With other values of $m_1$, $a$, and $g$ still better results may be obtained.

If the output level at frequencies different from $f_r$ is judged to be to low, an amplifier may be connected in series raising the level characteristics.

Fig. 4 shows a simplified circuit corresponding to the diagram of Fig. 3 and sufficient to follow the path of the alternating currents. The amplifier $m$ comprises only one tube $L_1$. To complete the amplifier circuit for the tube $L_1$ a plate supply voltage B+ is connected to the plate 8. The output of this tube is taken across the resistance 7 which is connected between the plate 8 and ground. The input is applied between the grid 9 and ground. The resistance 11 is the reverse feedback circuit corresponding to the block 5a in Fig. 3. It is connected between the cathode 10 of the amplifier and ground. The signal to be fed back through this resistance comes mainly through the resistance 7. The second reverse feedback, shown in Fig. 3 as block 6, consists of the tubes $L_2$ and $L_3$ connected in series. These circuits are connected to the cathode of the tube $L_1$ by means of the resistance 12 and this second reverse feedback path is in parallel with the first path, namely, the resistance 11. The feedback voltage is the output voltage from the tube $L_3$ and is taken from the plate of this tube. The output of the tube $L_2$ is taken from plate 13 which is connected to the grid 14 of the tube $L_3$. The source of signal to be fed back along this path is taken from the plate 8 of the tube $L_1$ through resistance 15. The tubes $L_2$ and $L_3$ have a feedback path of their own and this path consists of a simple RC bridge similar to that shown in Fig. 2 and labeled correspondingly. The voltage across the terminals 2 and 4 is a minimum when the bridge is balanced as described in connection with Fig. 2. This voltage is applied between the grid 16 and the cathode 17 of the tube $L_2$. The voltage E applied to the bridge across terminals 1, 3 comes from the output of the tube $L_3$ and thus feedback is obtained for this series connection of amplifiers. Thus it is seen the amplifier 6 comprises two tubes $L_2$ and $L_3$ and the simple RC bridge also. Naturally tubes with several grids may also be used.

The level characteristic of Fig. 5 is obtained from a device composed of two circuits each identical with that shown in Fig. 4 and connected in series. Fig. 5 also shows in dotted lines for comparison the characteristic of the simple RC bridge only.

It is noted that the fixed reverse feedback $a$ of $L_1$ is mainly produced by the resistances 7 and 11, the attenuation $g$ between the output of $L_3$ and the input of $L_1$ is produced mainly by the resistances 12 and 11 and the feedback $b$ by the simple RC bridge that is positioned between the output of $L_3$ and the input of $L_2$.

In order to conform better to the diagram of Fig. 3, and consequently to better isolate the elements of the circuit, Fig. 4 may be modified as shown in Fig. 6.

The diverse elements are arranged so as to obtain a better balance than in the case of the diagram of Fig. 4. Fig. 6 is similar to Fig. 4 and corresponding parts are labelled accordingly. However, instead of connecting resistance 7 to terminal 3 of the bridge, it is connected to a mid point in the arm of the bridge between resistance $R_2$ and resistance 19. Instead of connecting resistance 15 to terminal 1 of the bridge, it is connected to the mid-point between the resistances $R_1$ and 18.

The reverse feedback $a$ is produced by the resistances $7+r_2$ and 11. The attenuation $g$ which is composed on the one hand of the attenuation, between the output of $L_1$ and the input of $L_2$ is really the voltage applied across terminals 1, 3 of the "simple RC" bridge and is produced by the resistances 15, 7, $r_1$, $r_2$, 11, and 12 and on the other hand of the attenuation between the output of $L_3$ and the input of $L_1$ produced by the resistances 11 and 12. The two resistance arms of the RC-bridge comprise the resistances $r_1$, 18 and $r_2$, 19. To change the resonance frequency of the bridge the resistances and the capacities of the two other arms may be modified.

To increase the attenuation of the bridge at the resonance frequency, it may be exactly adjusted, as mentioned above, when the arrangement is in use.

In certain cases the fine adjustment of the bridge may be ensured automatically by means of the connection of a variable resistance controlled by the output voltage in series or in parallel with one of the resistance arms of the simple RC-bridge. To disclose in a better manner the operation of this adjustment we refer to Fig. 7, which shows either the output level of the bridge or of the complete device as a function of the resistance of the controlled resistance arm at the resonance frequency.

Theoretically the resistance of this arm is chosen so that the level corresponds to the point A and has therefore its minimum value. As this is impossible in practice, a smaller resistance is chosen, so that the level corresponds to the point B and it is ensured that any decrease of the output voltage tends to increase the resistance of the arm; that is to move the point B towards A. It follows that B tends to coincide with A and the bridge approaches its maximum attenuation at the resonance frequency. Such an arrangement is, however, only possible if the amplitude of the output level at other frequencies is very small, as these influence also the resistance of the arm and tend to keep the bridge from its condition of maximum attenuation at the resonance frequency.

Hence means for an automatic adjustment is particularly interesting in the case of the amplifier which is to eliminate a narrow frequency band, and thus to serve as a means for measuring a very slight distortion factor. In such a case the harmonics of $f_r$ are weak and the adjustment may ensure the completest possible elimination of $f_r$.

Fig. 8 shows means for providing such an automatic adjustment of the bridge in the case of the particular embodiment shown in Fig. 4.

The circuit shown in Fig. 8 is similar to that shown in Fig. 4 and corresponding parts are labeled similarly. However, one of the resistance arms of the bridge is shunted by the impedance of the cathode plate circuit of the tube $L_4$. The voltage on the grid 20 of this tube depends on the one hand on the output voltage from the plate 8 of tube $L_1$. The direct voltage from the plate voltage source B+ is blocked by a condenser 21. The voltage of grid 20 depends, on the other hand, on the variable direct voltage coming also from the output of the amplifier $L_1$ and rectified by the diode $L_5$. The grid 20 is properly biased by the battery 22 and the resistance 23 in series with the battery. The resistance 23 is adjusted so as to ensure the proper bias of the tube $L_4$ such that the bridge presents its maximum attenuation when it is desired that the output voltage of amplifier $L_1$ is to be zero. It is to be noted that a decrease in the output of $L_1$ causes an increase in the impedance of the cathode plate circuit of the tube $L_4$, since the cathode plate resistance of a triode increases directly with plate current. The value of the resistance $r_2$ of the arm of the bridge which has the tube $L_4$ in parallel with it is chosen so as to be slightly too large and hence the combined impedance of the tube in parallel with the resistance of the arm of the bridge is too small as desired and as was disclosed in connection with Fig. 7. Then a slight increase in the impedance of the tube $L_4$ increases the combined resistance and causes the bridge to be tuned exactly to the desired frequency.

What is claimed is:

1. An amplifier circuit comprising an amplifying unit having an input and a characteristic curve of transmission, an output circuit having an output level of signal, means for controlling the shape of said output level comprising a first reverse feedback circuit having a first characteristic of transmission and arranged between said output circuit and said input, said first characteristic being independent of the frequency of the signal and causing the output of said first reverse feedback circuit to be greater than the input thereto, and further comprising a second reverse feedback circuit having a second characteristic of transmission and being arranged between said output circuit and said input, said second reverse feedback circuit comprising means for feeding back a portion of the signal output of said second reverse feedback circuit, said second characteristic being variable with frequency and causing said output level of signal to be, in general, a reproduction of the shape of said characteristic curve, but with a sudden variation thereof.

2. An amplifier circuit for amplifying an oscillating signal comprising an amplifying unit having an input and a characteristic curve of transmission, an output circuit having an output level of signal, means for controlling the shape of said output level comprising a first reverse feedback circuit having a first characteristic of transmission and being arranged between said output circuit and said input and a second reverse feedback circuit having a second characteristic of transmission and being arranged between said output circuit and said input, said second reverse feedback circuit comprising an auxiliary amplifier with a reverse feedback circuit for causing the characteristic of transmission of said second feedback circuit to vary suddenly at a particular frequency.

3. An amplifier according to claim 2 in which the reverse feedback circuit of the auxiliary amplifier comprises a filter, said filter having an attenuation characteristic which is very great for certain frequencies.

4. An amplifier according to claim 2 in which the reverse feedback circuit of the auxiliary amplifier comprises a bridge circuit, two arms of said bridge comprising pure resistances, one arm of said bridge each comprising a resistance and a condenser in parallel, one arm of said bridge comprising a condenser and resistance in series, said bridge producing a high attenuation for the frequency at which it is balanced.

5. An amplifier according to claim 1, wherein said means for feeding back a portion of the signal output of the said second reverse feedback circuit comprises an automatically variable element, said element controlling the characteristic of transmission of said reverse feedback circuit and hence controlling the shape of the output level of the amplifying unit.

6. An amplifier according to claim 2 in which said auxiliary amplifier comprises an automatically variable element, said element controlling the characteristic of transmission of said second reverse feedback circuit and hence controlling the shape of the output level of the amplifying unit.

7. An amplifier according to claim 2 in which the auxiliary amplifier comprises an input circuit and an output circuit and the reverse feedback circuit of the auxiliary amplifier comprises a bridge circuit arranged between said output circuit and said input circuit, one arm of said bridge comprising a pure resistance, one arm of said bridge comprising a resistance and a condenser in parallel, one arm of said bridge comprising a resistance and condenser in series, one arm of said bridge comprising a variable impedance, said impedance comprising means for automatically controlling the value thereof such that the output level of feedback signal is automatically adjusted to a maximum value for the frequency at which it is desired that the output level of oscillating signal from the amplifier be a minimum.

8. An amplifier circuit comprising an amplifying unit having an input and an output circuit, a first reverse feedback circuit having a characteristic of transmission independent of the frequency of the signals and arranged between said output circuit and said input, and a second reverse feedback circuit including an amplifier arranged between said output circuit and said input, having a characteristic of transmission similar to that of said amplifying unit and an auxiliary feedback circuit for causing the characteristic of transmission of said feedback amplifier to vary suddenly at a particular frequency.

9. An amplifier circuit according to claim 8 in which said feedback amplifier comprises two amplifying stages connected in series and said auxiliary feedback circuit comprises a four terminal bridge circuit balanced at said particular frequency, one pair of diagonal terminals of said bridge circuit being connected across the output of the second of said amplifying stages and the other pair of diagonal terminals of said bridge circuit being connected to the input of the first of said amplifying stages.

MICHAEL RHEINGOLD.
STANISLAS VAN MIERLO.

REFERENCES CITED

The following references are of record in the file of this patent:

UNITED STATES PATENTS

| Number | Name | Date |
| --- | --- | --- |
| 2,102,671 | Black | Dec. 21, 1937 |
| 2,173,426 | Scott | Sept. 19, 1939 |
| 2,244,249 | Guanella | June 3, 1941 |
| 2,412,995 | Levy | Dec. 24, 1946 |